US006097147A

United States Patent [19]
Baldo et al.

[11] Patent Number: 6,097,147
[45] Date of Patent: Aug. 1, 2000

[54] STRUCTURE FOR HIGH EFFICIENCY ELECTROLUMINESCENT DEVICE

[75] Inventors: Marc A Baldo, Princeton, N.J.; Diarmuid F. O'Brien, Drumcondra, Ireland; Stephen R. Forrest, Princeton, N.J.

[73] Assignee: The Trustees of Princeton University, Princeton, N.J.

[21] Appl. No.: 09/153,144

[22] Filed: Sep. 14, 1998

[51] Int. Cl.$^7$ ................................................. H05B 33/00
[52] U.S. Cl. ........................ 313/506; 313/498; 428/917
[58] Field of Search ................................... 313/506, 498, 313/505, 509; 315/169.3; 428/690, 917

[56] References Cited

U.S. PATENT DOCUMENTS

| | | | |
|---|---|---|---|
| 4,455,506 | 6/1984 | Ayyagari et al. | 313/506 X |
| 4,758,765 | 7/1988 | Mitsumori | 313/506 |
| 4,769,292 | 9/1988 | Tang et al. . | |
| 4,950,950 | 8/1990 | Perry et al. . | |
| 5,294,870 | 3/1994 | Tang et al. . | |
| 5,540,999 | 7/1996 | Yamamoto et al. | 313/506 X |
| 5,663,573 | 9/1997 | Epstein et al. . | |
| 5,674,597 | 10/1997 | Fuji et al. . | |

FOREIGN PATENT DOCUMENTS

WO 96/19792    6/1996    WIPO .

OTHER PUBLICATIONS

S. W. Depp and W. E. Howard, "Flat Panel Displays," *Scientific American* 90 (Mar. 1993).

D. Z. Garbuzov et al., "Photoluminescence Efficiency and Absorption of Aluminum Tris–Quinolate ($Alq_3$) Thin Films," 249 *Chemical Physics Letters* 433–437 Dec. 1996.

C. E. Johnson et al., "Luminescent Iridium (I), Rhodium (I), and Platinum (II) Dithiolate Complexes," 105 *Journal of the American Chemical Society* 1795–1802 Dec. 1983.

Hosokawa et al., "Highly efficient blue electrolumincence from a distyrylarylene emitting layer with a new dopant," 67 *Appl. Phys. Lett.* 3853–3855 (Dec. 1995).

Adachi et al., "Blue light–emitting organic electroluminescent devices," 56 *Appl. Phys. Lett.* 799–801 (Feb. 1990).

C. C. Wu et al., "Integrated three–color organic light–emitting devices," 69 *Appl. Phys. Lett.* 3117–3119 (Nov. 1996).

H. Vestweber et al., "Electroluminescense from polymer blends and molecularly doped polymers," 64 *Synthetic Metals* 141–145 Dec. 1994.

Burrows et al., "Color Tunable Organic Light Emitting Devices," 69 *Appl. Phys. Lett.* 2959 (Nov. 11, 1996).

D. Z. Garbuzov et al., "Organic films deposited on Si p–n junctions: Accurate measurements of fluoresence internal efficiency, and application to luminescent antireflection coatings," 80 *J. Appl. Phys.* 4644–4648 (Oct. 1996).

P.E. Burrows et al., "Reliability and degradation of organic light emitting devices," 65 *Appl. Phys. Lett.* 2922–2924 (Dec. 1994).

H. A. MacLeod, *Thin Film Optical Filters*, pp. 94–110 Dec. 1969.

Johnson et al., "Electroluminescence from Single Layer Molecularly doped polymer films," 67 *Pure & Appl. Chem.*, 175–182 Dec. 1995.

*Primary Examiner*—Ashok Patel
*Attorney, Agent, or Firm*—Kenyon & Kenyon

[57] ABSTRACT

A light emitting device including a pixel having a substantially transparent anode; a hole transporting layer over the anode; an emission layer over the hole transporting layer; a blocking layer over the emission layer; an electron transporting layer over the blocking layer; and a cathode in electrical contact with the electron transporting layer.

20 Claims, 4 Drawing Sheets

STRUCTURE FOR HIGH EFFICIENCY ELECTROLUMINESCENT DEVICE

GOVERNMENT RIGHTS

This invention was made with Government suppport under Contract No. F33615-94-1-1414 awarded by DARPA. The government has certain rights in this invention.

Field of the Invention

The present invention relates to stacked electroluminescent devices, and more particularly to stacked electroluminescent devices that make use of exciton blocking layers for enhanced efficiency.

BACKGROUND

Organic light emitting devices (OLEDs), which make use of thin film materials that emit light when excited by electric current, are becoming an increasingly popular form of flat panel display technology. There are presently three predominant types of OLED construction: the "double heterostructure" (DH) OLED, the "single heterostructure" (SH) OLED, and the single layer polymer OLED. In the DH OLED, as shown in FIG. 1A, a transparent substrate 10 is coated by an anode layer 11. A thin (100–500 Å) organic hole transporting layer (HTL) 12 is deposited on the anode 11. Deposited on the surface of the HTL 12 is a thin (typically, 50 Å–500 Å) emission layer (EL) 13. The EL 13 provides the recombination site for electrons injected from a 100–500 Å thick electron transporting layer 14 (ETL) with holes from the HTL 12. Examples of prior art ETL, EL and HTL materials are disclosed in U.S. Pat. No. 5,294,870, the disclosure of which is incorporated herein by reference.

The device shown in FIG. 1A is completed by the deposition of metal contacts 15, 16 and a top electrode 17. Contacts 15 and 16 are typically fabricated from indium or Ti/Pt/Au. The electrode 17 is often a dual layer structure consisting of an alloy such as Mg/Ag 17' directly contacting the organic ETL 14, and an opaque, high work function metal layer 17" such as gold (Au) or silver (Ag) on the Mg/Ag. When proper bias voltage is applied between the top electrode 17 and the contacts 15 and 16, light emission occurs from the emission layer 13 through the substrate 10.

The SH OLED, as shown in FIG. 1B, makes use of multifunctional layer 13' to serve as both EL and ETL. One limitation of the device of FIG. 1B is that the multifunctional layer 13' must have good electron transport capability. Otherwise, separate EL and ETL layers should be included as shown for the device of FIG. 1A.

A single layer polymer OLED is shown in FIG. 1C. As shown, this device includes a glass substrate 1 coated by an anode layer 3. A thin organic layer 5 of spin-coated polymer, for example, is formed over the anode layer 3, and provides all of the functions of the HTL, ETL, and EL layers of the previously described devices. A metal electrode layer 6 is formed over organic layer 5. The metal is typically Mg or other conventionally-used low work function metal.

Light emission from OLEDs is typically via fluorescence or phosphorescence. Successful utilization of phosphorescence holds enormous promise for organic electroluminescent devices. For example, an advantage of phosphorescence is that all excitons (formed by the recombination of holes and electrons in an EL), which are triplet-based in phosphorescent devices, may participate in energy transfer and luminescence in certain electroluminescent materials. In contrast, only a small percentage of excitons in fluorescent devices, which are singlet-based, result in fluorescent luminescence.

In comparison to fluorescent devices, however, phosphorescent devices have several potential drawbacks that must be overcome to produce useful electroluminescence. For example, energy transfer is relatively slow, as long range dipole-dipole coupling (Förster transfer) is forbidden by spin conservation. Efficiency also decreases rapidly with current density, long phosphorescent lifetimes which cause saturation of emissive sites, and triplet-triplet annihilation. In addition, triplet diffusion lengths are typically long (e.g., >1400 Å) compared with typical singlet diffusion lengths of about 200 Å. Thus, if phosphorescent devices are to achieve their potential, device structures need to be optimized for triplet properties.

SUMMARY OF THE INVENTION

The present invention includes light emitting devices that include a pixel comprising a substantially transparent anode; a hole transporting layer over the anode; an emission layer over the hole transporting layer; a blocking layer over the emission layer; an electron transporting layer over the blocking layer; and a cathode in electrical contact with the electron transporting layer.

The blocking layer used in the devices of the present invention substantially blocks the diffusion of excitons, thus substantially keeping the excitons within the emission layer to enhance device efficiency.

An advantage of the present invention is that it provides enhanced electroluminescent organic light emitting devices.

Another advantage of the present invention is that it provides feasible and efficient phosphorescent electroluminescent devices.

Definitions

As used herein, the following phrases and terms have the following meanings:

"Alq$_3$" refers to aluminum tris (8-hydroxyquinoline).

"Anode" refers to a positively charged receiver of electrons that flow from a negatively charged cathode.

"Band gap" refers to the energy level difference between the lowest unoccupied molecular orbital of a material and its highest occupied molecular orbital.

"BCP" refers to bathocuproine.

"Blocking layer" refers to a layer comprising a material that substantially blocks the diffusion of excitons.

"Cathode" refers to a negatively charged device that emits electrons, which flow to a positively charged anode.

"CBP" refers to carbazole biphenyl.

"EL" refers to "emission layer," which is a layer in which holes and electrons recombine to produce excitons, which emit light.

"ETL" refers to "electron transporting layer," which is a layer used to supply electrons to an emission layer in a stacked OLED device.

"HTL" refers to "hole transporting layer," which is a layer used to supply holes to an emission layer in a stacked OLED device.

"NPD" refers to N,N'-diphenyl-N,N'-bis-alpha-napthylbenzidine.

"Pixel" refers to the smallest addressable unit on a display screen.

"PtOEP" refers to 2,3,7,8,12,13,17,18-octaethyl-21H, 23H-porphine platinum (II).

DETAILED DESCRIPTION

The present invention includes light emitting devices comprising a substantially transparent anode; a hole transporting layer over the anode; an emission layer over the hole transporting layer; a blocking layer over the emission layer; an electron transporting layer over the blocking layer; and a cathode in electrical contact with the electron transporting layer. The blocking layer used in the devices of the present invention substantially blocks the diffusion of excitons, thus substantially keeping the excitons within the emission layer to enhance device efficiency.

The devices of the present invention are most advantageously used with emissive materials that undergo phosphorescent electroluminescence. In such devices, holes from a hole transporting layer recombine in an emission layer with electrons from an electron transporting layer to form triplet-based excitons. Before emitting light, such excitons diffuse for a relatively long distance, thus enhancing the possibility that a percentage of the excitons will diffuse out of the emission layer before emitting light. In some cases, excitons diffuse to and are quenched by the cathode, causing non-radiative exciton decay. To help minimize such phenomena, the present invention makes use of a blocking layer that allows for the diffusion of electrons but substantially prevent the diffusion of excitons therethrough. The blocking layer may also substantially prevent the diffusion of holes therethrough. Excitons produced in an emission layer are thus confined to the emission layer, thus substantially enhancing device performance and efficiency.

The blocking layer of the present invention is characterized by a band gap between its lowest unoccupied molecular orbital and its highest occupied molecular orbital. In accordance with the present invention, this band gap substantially prevents the diffusion of excitons through the blocking layer, yet has only a minimal effect on the turn-on voltage of a completed electroluminescent device. The band gap is thus preferably greater than the energy level of excitons produced in an emission layer, such that such excitons are not able to exist in the blocking layer.

Figure 1A:
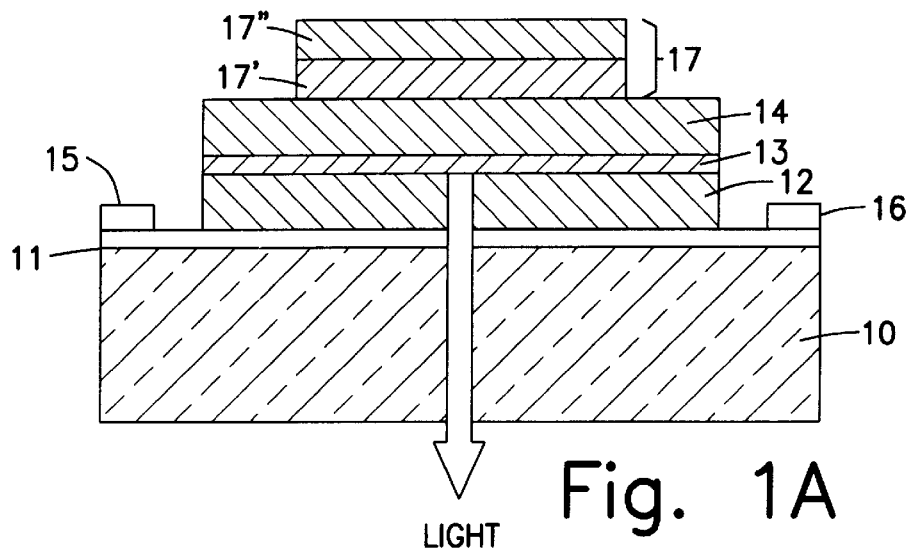
FIG. 1A is a cross sectional view of a typical organic double heterostructure light emitting device (OLED) according to the prior art.
Figure 1B:
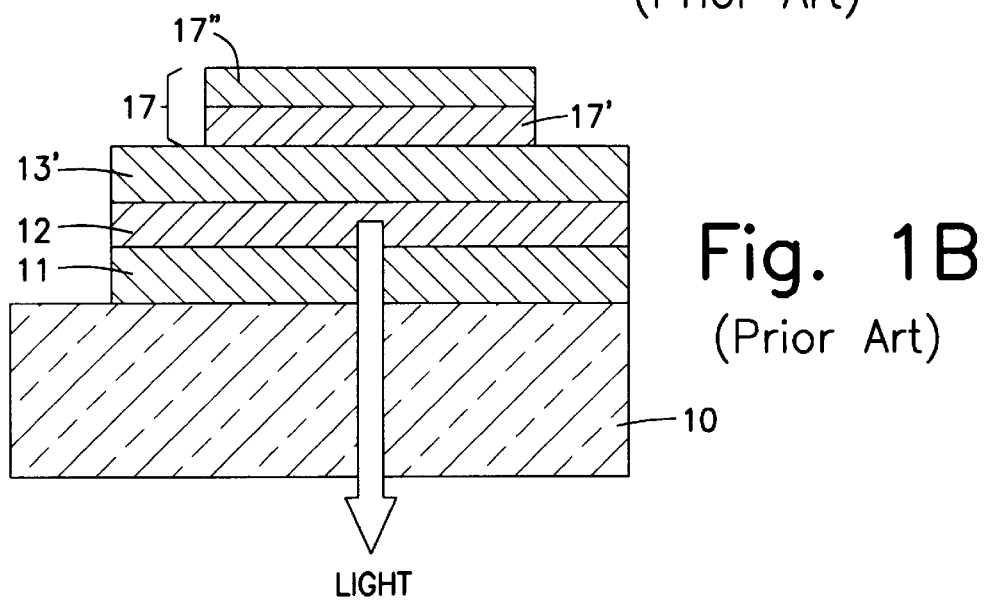
FIG. 1B is a cross sectional view of a typical organic single heterostructure light emitting device (LED) according to the prior art.
Figure 1C:
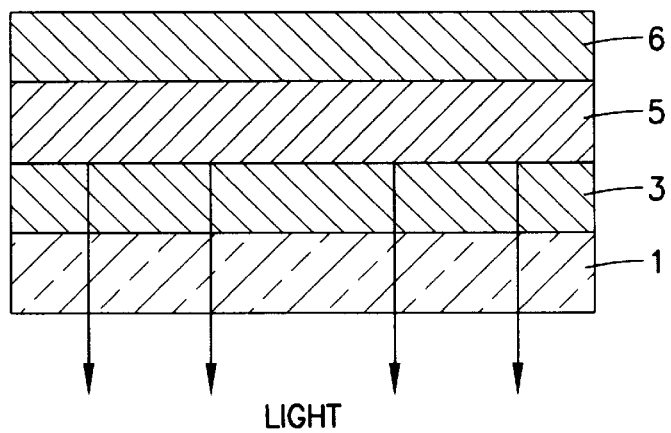
FIG. 1C is a cross sectional view of a known single layer polymer LED structure according to the prior art.
Figure 2:
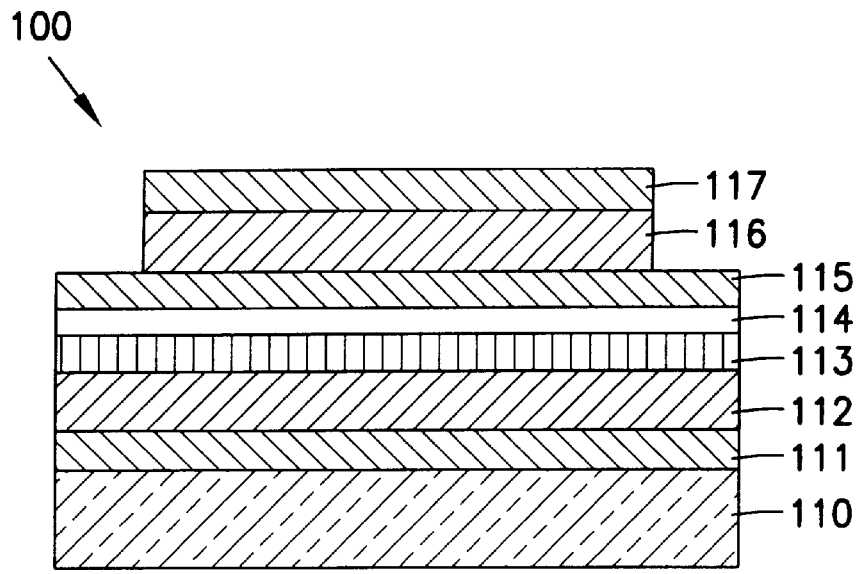
FIG. 2 is a cross sectional view of an embodiment of the present invention.

An embodiment of the present invention is shown in FIG. 2. The device 100 includes a substantially transparent substrate 110, a substantially transparent anode 111, a hole transporting layer 112, an emission layer 113, a blocking layer 114, an electron transporting layer 115, and a cathode 117. The emission layer 113 optionally also functions as an electron transporting layer. A low work function (preferably, <4 eV) metal layer 116 is optionally formed over the electron transporting layer 115. The metal layer 116 serves both as a contact material and as a reflective material for reflection of impinging light beams. Light emission from the emission layer 113 occurs when a voltage is applied between the cathode 117 and the anode 111. The blocking layer 114 substantially prevents the diffusion of excitons from the emission layer 113 into the electron transporting layer 115. The excitons are also substantially prevented from diffusing into the hole transporting layer 111 due to an energy barrier at the interface between the emission layer 113 and the hole transporting layer 111. The excitons are thus substantially confined within the emission layer 113.

The materials used in the device 100 include any suitable materials which fulfill the purpose(s) of the respective layer(s). The following materials are provided for illustrative purposes only. For example, the substrate 110 is generally fabricated from a transparent material, such as glass, quartz, sapphire or plastic. The substrate 110 is, for example, rigid, flexible, and/or shaped to a desired configuration. The anode 111 comprises any substantially transparent, conductive material such as indium tin oxide. Suitable candidates for the metal layer 116 include Mg, Mg/Ag, and Li/Al. The cathode 117 is made of ITO, Al, Ag or Au, for example.

The blocking layer 114 is made from any suitable material having a sufficient band gap to substantially prevent the diffusion of excitons therethrough. By way of example, suitable candidates for the blocking layer 114 include NPD, CBP, BCP and Alq$_3$. The choice of blocking layer material will depend on the choice of material used in the emission layer, as the blocking layer material need only have a larger band gap than the energy level of the excitons formed in the emission layer, which depends upon the material used in the emission layer. By way of example, the blocking layer 114 is made from BCP when the emission layer 513 comprises CBP.

The materials used in the HTL, EL and ETL are known in the art. For example, for blue emission, the emission layer 113 comprises any suitable blue light-emissive organic compound such as, for example, trivalent metal quinolate complexes, Schiff base divalent metal complexes, metal acetylacetonate complexes, metal bidentate ligand complexes, bisphosphonates, metal maleontriledithiolate complexes, molecular charge transfer complexes, aromatic and heterocyclic polymers and rare earth mixed chelates. The metal bidentate complexes which may be used for the layer 113 have the formula $MDL^4_2$ wherein M is selected from trivalent metals of Groups 3–13 of the Periodic Table and Lanthanides. The preferred metal ions are $Al^{+3}$, $Ga^{+3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu) phenol; 2,6-di(t-bu) phenol; 2,6-di(t-bu) cresol; and $H_2Bpz_2$. By way of example, the wavelength resulting from measurement of photoluminescence in the solid state of aluminum (picolymethylketone) bis [2,6-di(t-bu) phenoxide] is 420 nm. The cresol derivative of this compound also measured 420 nm. Aluminum (picolylmethyl-ketone) bis (OsiPh$_3$) and scandium (4-methoxy-picolyl-methylketone) bis (acetylacetonate) each measured 433 nm, while aluminum [2-(O-phenoxy) pyridine] bis [2,6-di(t-bu) phenoxide] measured 450 nm.

Examples of green OLED materials include tin (iv) metal complexes, such as those having the formula $SnL^1_2L^2_2$ where $L^1$ is selected from salicylaldehydes, salicyclic acid or quinolates (e.g. 8-hydroxyquinoline). $L^2$ can be substituted and unsubstituted alkyl, aryl and heterocyclic groups. When $L^1$ is a quinolate and $L^2$ is a phenyl, for example, the tin (iv) metal complex will have an emission wavelength of 504 nm.

Examples of red OLED materials include divalent metal maleonitriledithiolate ("mnt") complexes, such as those described by C. E. Johnson et al. in "Luminescent Iridium (I), Rhodium(I), and Platinum(II) Dithiolate Complexes," 105 *Journal of the American Chemical Society* 1795 (1983). For example, the mnt [Pt ($Pph_3$)] has a characteristic wavelength emission of 652 nm.

Additional OLED materials are known in the art (see, e.g., U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," 67 *Applied Physics Letters* 3853–55 (December 1995); Adachi et al., "Blue light-emitting organic electroluminescent devices," 56 *Applied Physics Letters* 799–801 (February 1990); Burrows et al., "Color-Tunable Organic Light Emitting Devices," 69 *Applied Physics Letters* 2959–61 (November 1996)). The entire disclosures of these references are hereby incorporated by reference. Distyrylarylene derivatives such as those described in Hosokawa et al. are a preferred class of compounds.

Phosphorescent and fluorescent dyes which may be used in the emission layer of the devices of the present invention are also known in the art. U.S. Pat. Nos. 4,769,292 and 5,294,870, the disclosures of which are hereby incorporated by reference, are illustrative. Phosphor dyes are, for example, vacuum deposited in a solid polymer matrix or dissolved in matrix polymer such as polymethylmethacrylate. Examples of green fluorescent dyes are polymethine dyes including cyanines, merocyanines, complex cyanines and merocyanines, oxonols, hemioxonols, styryls, merostyryls and streptocyanines. Examples of red fluorescent dyes are 4-dicyano-methylene-4H-pyrans and 4dicyanomethylene-4H-thiopyrans.

In an embodiment of the present invention, the emission layer undergoes phosphorescent electroluminescence and comprises a phosphor in an organic host. In a preferred embodiment, the emission layer comprises CBP doped with PtOEP.

The deposition techniques for any of the abovelisted layers and materials are well-known in the art. For example, the preferred method of depositing the OLED layers (i.e., HTL, EL and ETL layers) is by thermal evaporation (or spin coating if a polymer LED is used); the preferred method of depositing metal layers is by thermal or electron-beam evaporation; and the preferred method of depositing indium tin oxide is by electron-beam evaporation or sputtering.

The present invention is used to provide efficient, high brightness, monochromatic or multicolor, flat panel displays of any size. The images created on such displays could be text or illustrations in full-color, in any resolution depending on the size of the individual LED's. Display devices of the present invention are therefore appropriate for an extremely wide variety of applications including billboards and signs, computer monitors, and telecommunications devices such as telephones, televisions, large area wall screens, theater screens and stadium screens. The structures described herein are included, for example, in a plurality of pixels in a light emitting device or as part of a single-pixel device. Moreover, the structures described herein may be used as part of a laser device.

The present invention is further described with reference to the following non-limiting example:

Example

Figure 3:
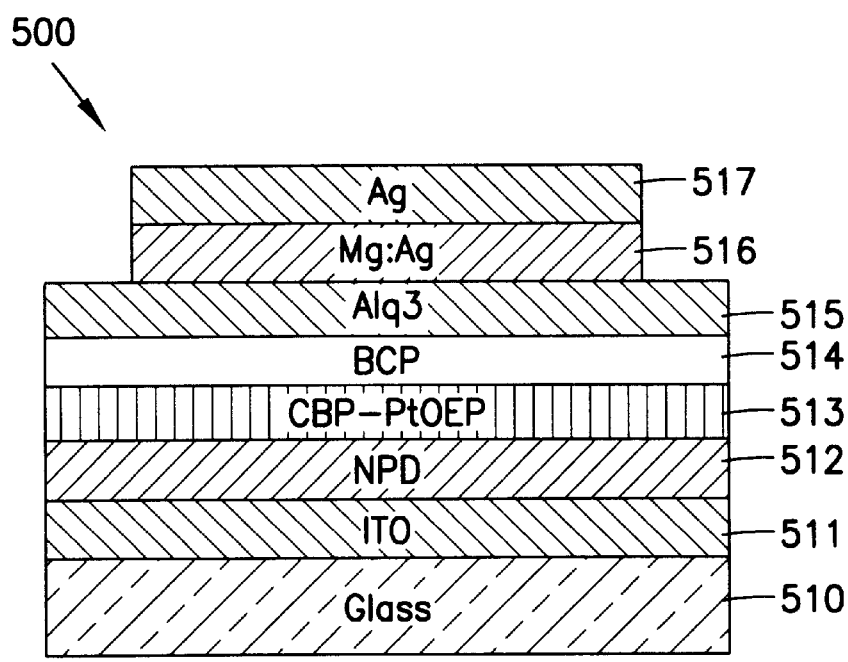
FIG. 3 is a cross sectional view of an exemplary embodiment of the present invention.

A phosphorescent electroluminescent device 500 as shown in FIG. 3 was formed using conventional deposition techniques. The device 500 included the following layers deposited onto a glass substrate 510: an anode 511 comprising indium tin oxide, a HTL 512 of approximately 450 Å thickness comprising NPD, an EL 513 of approximately 400 Å thickness comprising CBP doped with about 8% PtOEP, a blocking layer 514 of approximately 80 Å thickness comprising BCP, an ETL 515 of approximately 250 Å thickness comprising $Alq_3$, a contact layer 516 of approximately 1000 Å thickness comprising magnesium-silver alloy, and a cathode 517 of 500 Å thickness comprising silver.

Figure 4:
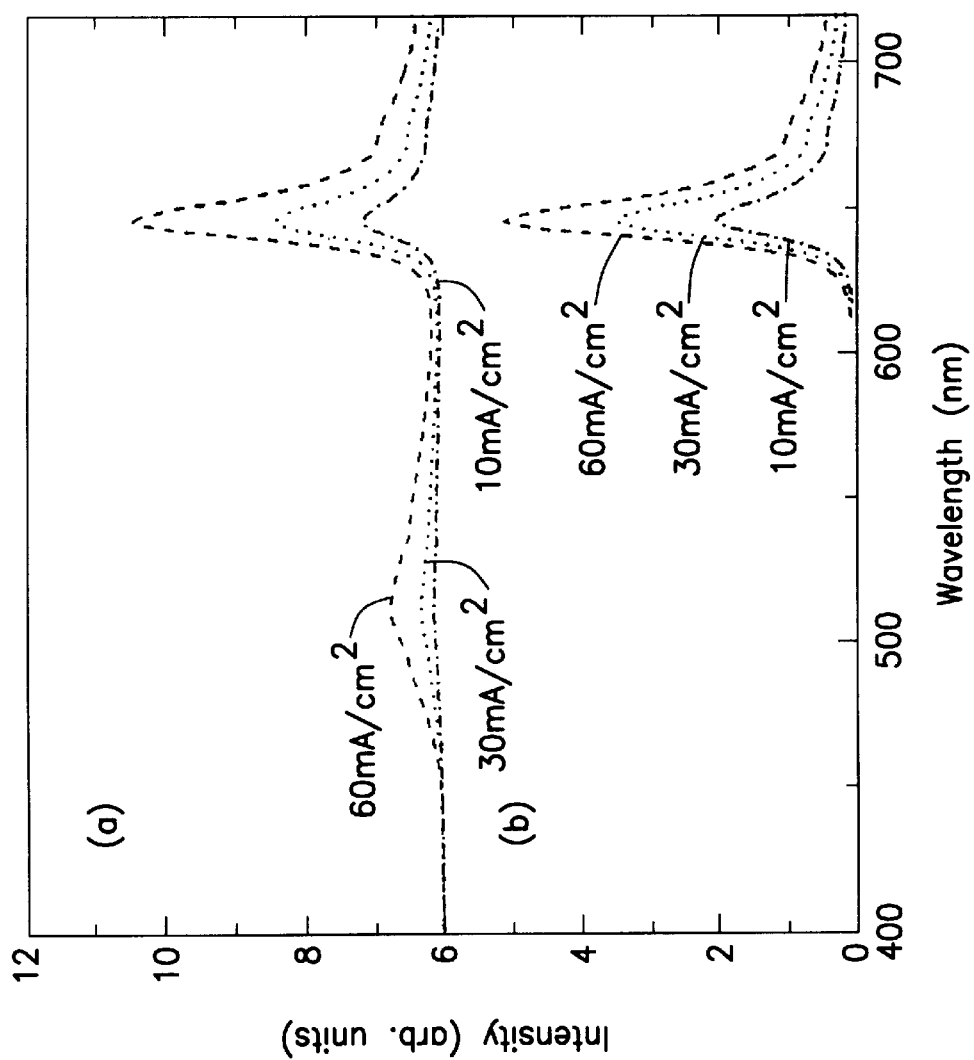
FIG. 4(a) is an emission spectra for a stacked light emitting device not including a blocking layer.
FIG. 4(b) is an emission spectra for a stacked light emitting device including a blocking layer, in accordance with an embodiment of the present invention.

The blocking layer 514 was included in the device 500 to prevent exciton diffusion from the EL 513 into the ETL 515. The exciton blocking function of the layer 514 is demonstrated by a comparison of the spectra in FIGS. 4(a) and 4(b). In FIG. 4(a), the emission spectra of a device without the blocking layer 514 (but otherwise identical to the device 500) is shown for a range of current densities. Whereas strong green emission at about $\lambda=520$ nm was seen from the $Alq_3$ ETL 515 for the device without the blocking layer 514, such emission was not observed for the device 500 where the blocking layer 514 prevented exciton diffusion into the ETL 515 and corresponding $Alq_3$ emission (FIG. 4(b)).

Figure 5:
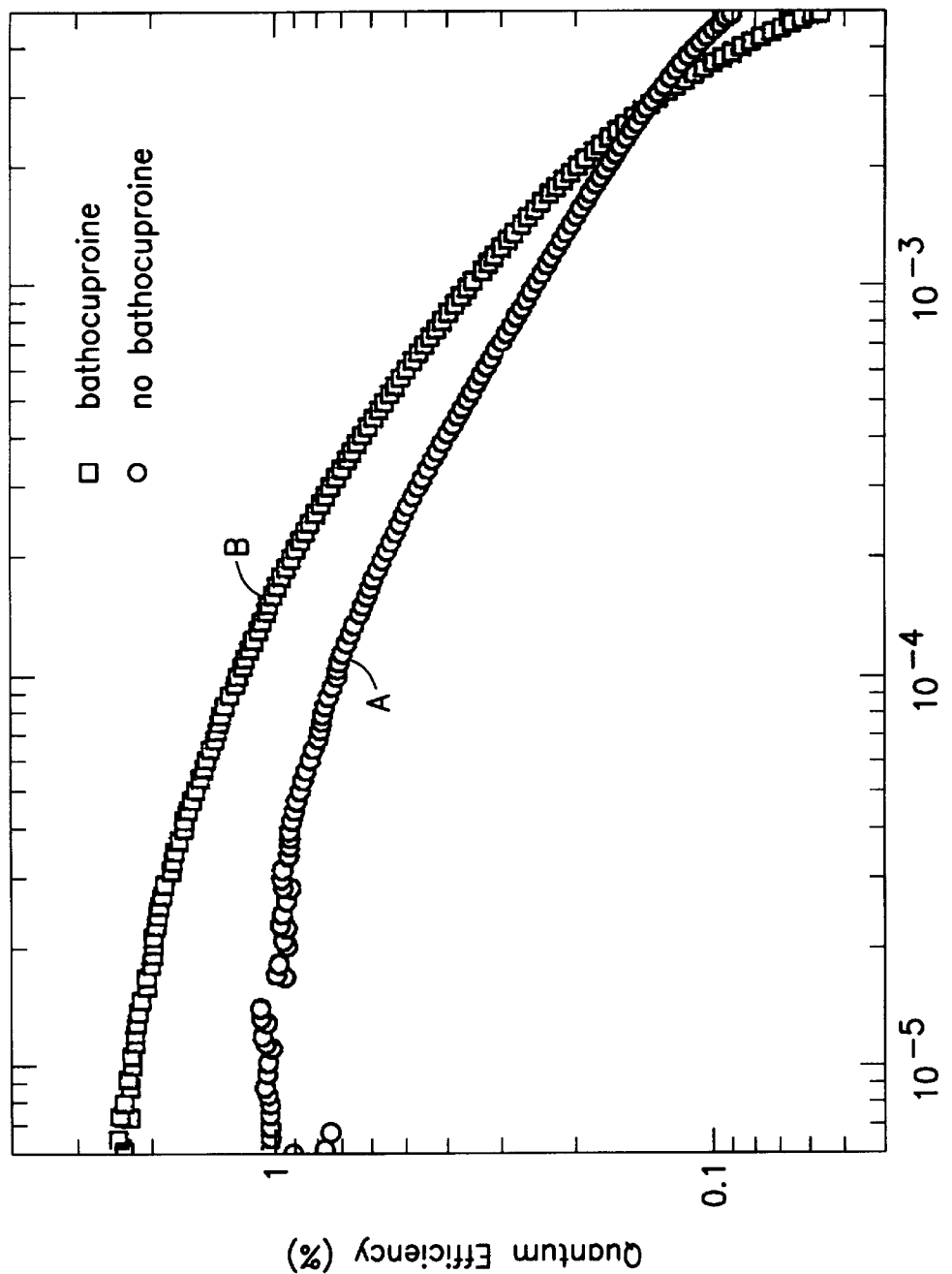
FIG. 5 compares the efficiency of a stacked light emitting device including a blocking layer according to an embodiment of the present invention to a stacked light emitting device not including a blocking layer.

In addition to blocking exciton diffusion from the EL 513, use of the blocking layer 514 resulted in an improvement in device efficiency by forcing triplets to substantially remain in the EL 513. As shown in FIG. 5, the quantum efficiency of the device without the blocking layer 514 dropped to about 0.55% at a luminance of 100 $cd/m^2$ (curve A), whereas that for the device 500 dropped only to about 0.9% at the same luminance (curve B).

The present invention provides high efficiency electroluminescent devices, particularly for phosphorescent emission. Those with skill in the art may recognize various modifications to the embodiments of the invention described and illustrated herein. Such modifications are meant to be covered by the spirit and scope of the appended claims.

We claim:

1. A light emitting device including a pixel comprising:

a substantially transparent anode;

a hole transporting layer over said anode;

an emission layer over said hole transporting layer;

a blocking layer over said emission layer;

an electron transporting layer over said blocking layer; and a cathode in electrical contact with said electron transporting layer.

2. The device of claim 1, wherein said blocking layer is characterized by a band gap greater than the energy level of excitons formed in said emission layer.

3. The device of claim 2, wherein said blocking layer comprises a material selected from the group consisting of BCP, $Alq_3$, CBP, and NPD.

4. The device of claim 3, wherein said blocking layer comprises BCP.

5. The device of claim 4, wherein said emission layer comprises CBP doped with PtOEP.

6. The device of claim 1, wherein said anode comprises indium tin oxide.

7. The device of claim 1, wherein said emission layer also functions as an electron transporting layer.

8. The device of claim 1, wherein said emission layer emits light by phosphorescence.

9. The device of claim 8, wherein said emission layer comprises a phosphor in an organic host.

10. The device of claim 9, wherein said phosphor comprises PtOEP and said organic host comprises CBP.

11. The device of claim 1, wherein said emission layer emits light by fluorescence.

12. The device of claim 1, further comprising a transparent substrate under said anode.

13. The device of claim 12, wherein said substrate comprises glass.

14. The device of claim 1, wherein said cathode comprises a metal selected from the group consisting of aluminum, silver, gold, and alloys thereof.

15. The device of claim 1, further comprising a contact layer between said electron transporting layer and said cathode.

16. An electronic device incorporating the device of claim 1, said electronic device selected from the group consisting of a computer; a television; a large area wall, theater or stadium screen; a billboard; a sign; a vehicle; a printer; a telecommunication device; and a telephone.

17. A light emitting device including a pixel comprising:
   a transparent substrate;
   a substantially transparent anode over said substrate, said anode comprising indium tin oxide;
   a hole transporting layer over said anode, said hole transporting layer comprising NPD;
   an emission layer over said hole transporting layer, said emission layer comprising CBP and emitting light by phosphorescence;
   a blocking layer over said emission layer, said blocking layer BCP;
   an electron transporting layer over said blocking layer, said electron transporting layer comprising $Alq_3$; and
   a cathode in electrical contact with said electron transporting layer.

18. A multicolor display device comprising a plurality of pixels, wherein at least one of said pixels comprises:
   a substantially transparent anode;
   a hole transporting layer over said anode;
   an emission layer over said hole transporting layer;
   a blocking layer over said emission layer;
   an electron transporting layer over said blocking layer; and
   a cathode in electrical contact with said electron transporting layer.

19. The device of claim 18, wherein said blocking layer is characterized by a band gap greater than the energy level of excitons formed in said emission layer.

20. An electronic device incorporating the device of claim 18, said electronic device selected from the group consisting of a computer; a television; a large area wall, theater or stadium screen; a billboard; a sign; a vehicle; a printer; a telecommunication device; and a telephone.

* * * * *